United States Patent [19]

Walls et al.

[11] Patent Number: 5,316,892
[45] Date of Patent: May 31, 1994

[54] METHOD FOR DEVELOPING LITHOGRAPHIC PRINTING PLATES

[75] Inventors: John E. Walls; Gary R. Miller; Raymond W. Ryan, Jr., all of Fort Collins, Colo.

[73] Assignee: Eastman Kodak Company, Rochester, N.Y.

[21] Appl. No.: 918,869

[22] Filed: Jul. 23, 1992

[51] Int. Cl.$^5$ .......................... G03F 7/30; G03F 7/32; G03F 7/021
[52] U.S. Cl. .................................... 430/309; 430/302; 430/325; 430/331; 430/175; 430/176; 430/157
[58] Field of Search ............... 430/302, 325, 331, 309, 430/175, 176, 157,

[56] References Cited

U.S. PATENT DOCUMENTS

| | | | |
|---|---|---|---|
| 3,701,657 | 10/1972 | Moore et al. | 430/302 |
| 3,707,373 | 12/1972 | Martinson et al. | 430/294 |
| 4,186,006 | 1/1980 | Kobayashi et al. | 430/302 |
| 4,308,340 | 12/1981 | Walls | 430/331 |
| 4,350,756 | 9/1982 | Burch | 430/331 |
| 4,395,480 | 7/1983 | Sprintschnik | 430/309 |
| 4,652,604 | 3/1987 | Walls et al. | 430/176 |
| 4,716,098 | 12/1987 | Mack et al. | 430/331 |
| 4,741,985 | 5/1988 | Aoai et al. | 430/176 |
| 4,851,324 | 7/1989 | Hsieh | 430/302 |
| 4,940,646 | 7/1990 | Pawlowski | 430/176 |
| 5,035,982 | 7/1991 | Walls | 430/331 |
| 5,053,315 | 10/1991 | West et al. | 430/278 |
| 5,081,003 | 1/1992 | Dhillon | 430/331 |

FOREIGN PATENT DOCUMENTS

| | | |
|---|---|---|
| 0080042 | 6/1983 | European Pat. Off. . |
| 1515174 | 6/1978 | United Kingdom . |
| 2110401 | 6/1983 | United Kingdom . |

Primary Examiner—Janis Dote
Attorney, Agent, or Firm—Alfred P. Lorenzo

[57] ABSTRACT

A negative-working lithographic printing plate having a radiation-sensitive layer comprising a diazo resin, an acid-substituted ternary acetal polymer and an unsaturated polyester is developed with an aqueous developing composition comprising an organic solvent, an anionic surface active agent, sodium oxalate, sodium nitrate or an alkali metal tetraborate an aliphatic monocarboxylic acid, an aliphatic dicarboxylic acid and sufficient alkaline buffering system to provide an alkaline pH. The method effectively avoids problems of blinding and background sensitivity which are of critical concern in the printing art.

17 Claims, No Drawings

METHOD FOR DEVELOPING LITHOGRAPHIC PRINTING PLATES

CROSS-REFERENCE TO RELATED APPLICATIONS

Lithographic printing plates utilized in the method of this invention are disclosed and claimed in copending commonly assigned U.S. patent application Ser. No. 918,868, filed Jul. 23, 1992, "Photosensitive Compositions And Lithographic Printing Plates With Reduced Propensity To Blinding" by John E. Walls.

Developing compositions utilized in the method of this invention are disclosed and claimed in copending commonly assigned U.S. patent application Ser. No. 918,988 filed Jul. 23, 1992, "Aqueous Developer For Lithographic Printing Plates With Improved Desensitizing Capability" by John E. Walls, Gary R. Miller and Raymond W. Ryan, Jr.

FIELD OF THE INVENTION

This invention relates in general to lithography and in particular to a method of developing a lithographic printing plate. More specifically, this invention relates to a method of developing a lithographic printing plate which minimizes problems of blinding and background sensitivity.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced; such as paper, cloth and the like. Commonly the ink is transferred to an intermediate material called the blanket which in turn transfers the ink to the surface of the material upon which the image is to be reproduced.

The most common type of lithographic printing plate to which the present invention is directed has a light-sensitive coating applied to an aluminum base support. The coating may respond to light by having the portion which is exposed become soluble so that it is removed in the developing process. Such a plate is referred to as positive-working. Conversely, when that portion of the coating which is exposed becomes hardened the plate is referred to as negative-working In both instances the image area remaining is ink-receptive or oleophilic and the non-image area or background is water-receptive or hydrophilic. The differentiation between image and non-image areas is made in the exposure process where a film is applied to the plate with a vacuum to insure good contact. The plate is then exposed to a light source, a portion of which is composed of UV radiation. In the instance where a positive plate is used, the area on the film that corresponds to the image on the plate is opaque so that no light will strike the plate, whereas the area on the film that corresponds to the non-image area is clear and permits the transmission of light to the coating which then becomes more soluble and is removed. In the case of a negative plate the converse is true. The area on the film corresponding to the image area is clear while the non-image area is opaque. The coating under the clear area of film is hardened by the action of light while the area not struck by light is removed. The light-hardened surface of a negative plate is therefore oleophilic and will accept ink while the non-image area which has had the coating removed through the action of a developer is desensitized and is therefore hydrophilic.

Most developer compositions for negative-working printing plates disadvantageously consist primarily of organic solvents which are offensive through their volatility and high concentration, pose toxic exposure hazards to the end user and are pollutants to the environment when evaporated into the air and/or discharged into public waterways. Presently there is a trend toward the use of aqueous developers Typically, these aqueous developers also contain organic solvents at concentrations which are still environmentally harmful and toxic to the end user. The prime advantage is that the solvents are not odor-wise offensive. They have the disadvantage of having a strongly alkaline pH, cause redeposit on the plate and machine parts, and solubilize the coating residue which creates disposal problems and reduces the effective life of the developer in a processing machine. The present invention utilizes a composition which substantially alleviates these problems.

Aqueous alkaline developing compositions, for use with negative-working lithographic printing plates, which contain an organic solvent and a surface active agent are well known. Such developing compositions are described for example in U.S. Pat. Nos. 3,701,657, 3,707,373, 4,186,006, 4,308,340, 4,350,756, 4,395,480, 4,716,098, 5,035,982, European Patent No. 0 080 042, British Patent No. 1,515,174 and British Patent No. 0 2,110,401. As disclosed in U.S. Pat. Nos. 3,701,657, 3,707,373, 4,350,756, 4,395,480 and 4,716,098 it is also known to incorporate in such developing compositions an aliphatic carboxylic acid or salt thereof. Such developers are generally quite effective but suffer from disadvantages which have hindered their commercial utilization, for example, they may not be able to adequately desensitize residual coating which remains in the background areas of the printing plate.

One of the more serious problems which can afflict negative-working lithographic printing plates is inability of the developer to remove all residual coating from the non-image areas of the plate. When sufficient residual coating remains, a condition exists for background sensitivity to occur during the printing process. Minimally, the effect would be to increase the amount of water required in the fountain solution Under more severe conditions, ink may adhere to the background and ultimately to the printed sheet, thereby resulting in a condition known as "tinting" or "toning." Under extremely severe conditions, there is so much ink in the background that it is referred to as "scumming."

Among the requirements for an effective developer are (1) that it be resistant to oxidation, (2) that it be capable of dissolution-type processing, i.e., that the photosensitive composition dissolves fully in the developing solution rather than breaking up in the form of particles, and (3) that it be effective in desensitizing the non-image areas.

A particularly advantageous negative-working lithographic printing plate is that described and claimed in copending commonly assigned U.S. patent application Ser. No. 918,868, filed Jul. 23, 1992; "Photosensitive Compositions And Lithographic Printing Plates With Reduced Propensity To Blinding" by John E. Walls. This plate comprises an imaging layer containing a diazo resin, an acid-substituted ternary acetal polymer and an unsaturated polyester. One of its major advantages is its ability to resist blinding. As is well understood in the art, the term "blinding" refers to inability of the image areas to adequately take up the printing ink. In the printing plates of the aforesaid U.S. patent application Ser. No. 918,868, an important feature contributing to the ability to resist blinding is the presence of the unsaturated polyester. However, these plates sometimes exhibit a yellow stain. The use of the unsaturated polyester is, in part, connected with the stain. There appear to be other, as yet poorly understood, factors contributing to the stain. The yellow stain is known to be an extremely thin but strongly adhering layer of diazo resin and polymeric binder which is not removed in the developing process when conventional developers are used. The intensity of the stain is proportional to the amount of residual coating.

It is toward the objective of providing an improved development process which overcomes problems of the prior art with respect to both blinding and background sensitization that the present invention is directed.

SUMMARY OF THE INVENTION

In accordance with this invention, an aqueous alkaline developing composition comprised of:
(1) an organic solvent,
(2) an anionic surface active agent,
(3) sodium oxalate, sodium nitrate or an alkali metal tetraborate,
(4) an aliphatic monocarboxylic acid, preferably containing 6 to 22 carbon atoms,
(5) an aliphatic dicarboxylic acid, preferably containing 4 to 16 carbon atoms, and
(6) an alkaline buffering system in an amount sufficient to provide an alkaline pH, is employed to develop a negative-working lithographic printing plate comprised of a support having thereon a radiation-sensitive layer comprising a diazo resin, an acid-substituted ternary acetal polymer and an unsaturated polyester.

DESCRIPTION OF THE PREFERRED EMBODIMENTS

As indicated hereinabove, the ingredients required in the aqueous alkaline developing composition utilized in this invention are (1) an organic solvent, (2) an anionic surface active agent, (3) sodium oxalate, sodium nitrate or an alkali metal tetraborate, (4) an aliphatic monocarboxylic acid, preferably containing 6 to 22 carbon atoms, (5) an aliphatic dicarboxylic acid, preferably containing 4 to 16 carbon atoms, and (6) an alkaline buffering system in an amount sufficient to provide an alkaline pH.

The function of the organic solvent is to assist in the removal of the non-exposed portions of the photosensitive coating. Any of a wide variety of solvents can be used, with those typically employed being high boiling liquids. The most preferred solvent is 2-phenoxy propanol due to its excellent solvent action and very low toxicity. Other suitable solvents include, but are not restricted to, 2-phenoxy ethanol, benzyl alcohol, N-methyl pyrrolidone, butyrolactone, propylene glycol monomethyl ether and the like. The organic solvent can be employed in the developing composition in an amount of from about 0.2 to about 16 weight percent, more preferably in an amount of from about 1 to about 10 weight percent, and most preferably in an amount of from about 2.5 to about 7 weight percent.

The anionic surface active agent serves to reduce the surface tension so as to facilitate better penetration of the developer into the coating as well as to provide some cleaning action and dispersion of the coating composition that is removed. Any of a wide variety of anionic surface active agents, especially sulfate and sulfonate alkyl and aryl alkyl anionic surface active agents, can be used. Sodium octyl sulfate is preferred. Other suitable anionic surface active agents include, but are not restricted to, potassium decyl sulfate, sodium toluene sulfonate, sodium xylene sulfonate, sodium dodecylbenzene sulfonate, potassium tridecylbenzene sulfonate, lithium dinonadecylbenzene sulfonate, sodium docosanylbenzene sulfonate, potassium methyl naphthalene sulfonate, lithium triethyl naphthalene sulfonate, sodium isopropyl naphthalene sulfonate, sodium diisopropyl naphthalene sulfonate, sodium dibutyl naphthalene sulfonate, and the like. The anionic surface active agent can be employed in the developing composition in an amount of from about 0.2 to about 15 weight percent, more preferably in an amount of about 0.8 to about 12 weight percent and most preferably in an amount of about 1.2 to about 8 weight percent.

The sodium oxalate, sodium nitrate or alkali metal tetraborate serves to elevate the activity of the developing composition, particularly as it relates to the desensitization of the background. Potassium tetraborate is preferred for this purpose but sodium tetraborate and lithium tetraborate are also useful. The sodium oxalate, sodium nitrate or alkali metal tetraborate can be employed in the developing composition in an amount of from about 0.01 to about 7 weight percent, more preferably in an amount of about 0.05 to about 5 weight percent, and most preferably in an amount of from about 0.1 to about 3 weight percent.

The function of the aliphatic monocarboxylic acid is to effectively remove diazo resin from the background areas as well as partially insolubilized diazo resin from and around the image area, thereby precluding or at least minimizing the possibility of "hot-spot" formation or halation. Preferred aliphatic monocarboxylic acids for this purpose are those containing 6 to 22 carbon atoms. The most preferred aliphatic monocarboxylic acid is nonanoic acid (also known as pelargonic acid). Other suitable aliphatic monocarboxylic acids include, but are not restricted to, hexanoic acid, octanoic acid, decanoic acid, undecanoic acid, dodecanoic acid, pentadecanoic acid, octadecanoic acid, eicosanoic acid, docosanoic acid, and the like. The aliphatic monocarboxylic acid can be employed in the developing composition in an amount of from about 0.5 to about 12 weight percent, more preferably in an amount of about 1.5 to about 10 weight percent, and most preferably in an amount of about 2.5 to about 8 weight percent.

The function of the aliphatic dicarboxcylic acid is to enhance the desensitization of both image and background areas. When both an aliphatic monocarboxylic acid and an aliphatic dicarboxylic acid are incorporated in the developer, the degree to which the background is cleaned is significantly and surprisingly improved in comparison with use of only an aliphatic monocarboxylic acid or only an aliphatic dicarboxylic acid. Preferred aliphatic dicarboxylic acids for this purpose are those containing 4 to 16 carbon atoms. The most preferred aliphatic dicarboxylic acid is sebacic acid. Other suitable aliphatic dicarboxylic acids include, but are not restricted to, succinic acid, glutaric acid, adipic acid, pimelic acid, suberic acid, azelaic acid, dodecanedioic acid, hexadecanedioic acid, and the like. The aliphatic dicarboxylic acid can be employed in the developing composition in an amount of from about 0.05 to about 10 weight percent, more preferably in an amount of about 0.2 to about 5 weight percent, and most preferably in amount of about 0.4 to about 3 weight percent.

Since the developing composition must be alkaline, salts of the acids are employed to formulate the developing composition or are formed in its manufacture. Potassium hydroxide is preferably used to form the potassium salts although sodium and lithium salts are also useful. Potassium carbonate is advantageously employed to provide the desired working pH and to impart buffering capability, but other common buffering agents, such as, for example, trisodium phosphate, disodium phosphate, sodium phthalate, sodium citrate, sodium ascorbate and sodium tartrate, can be used if desired.

The alkaline buffering system, for example, the combination of potassium hydroxide and potassium carbonate, can be utilized in any amount sufficient to provide an alkaline pH. The pH of the working strength developing composition is preferably in the range of from 8 to 12, more preferably in the range of 8.5 to 11, and most preferably in the range of 9 to 10. Suitable amounts of potassium hydroxide or other alkaline salt-forming agents are in the range of from about 0.1 to about 8 weight percent, more preferably in the range of about 0.05 to about 6 weight percent, and most preferably in the range of about 0.1 to about 3 weight percent. The potassium hydroxide or other alkaline agent, is preferably used only in the mole ratio required to form salts of the carboxylic acids or in just a slight excess over this amount.

In addition to the required ingredients specified above, various optional ingredients can also be included in the developing composition. A particularly useful optional ingredient is an antifoaming agent and particularly useful antifoaming agents are polydimethyl siloxanes such as BURST RSD-10 Antifoam which is commercially available from HYDROLABS Company, Wayne, New Jersey. The antifoam is preferably used in the developing composition in an amount in the range from about 0.001 to about 3 weight percent, more preferably in the range from about 0.005 to about 1 weight percent, and most preferably in the range of from about 0.01 to about 0.5 weight percent.

In the method of this invention, the aqueous alkaline developing composition described above is utilized with the lithographic printing plates described in co-pending commonly assigned U.S. patent application Ser. No. 918,868, filed Jul. 23, 1992, "Photosensitive Compositions And Lithographic Printing Plates With Reduced Propensity To Blinding", by John E. Walls.

The lithographic printing plates of the aforesaid copending patent application Ser. No. 918,868 are comprised of a support having thereon a radiation-sensitive layer comprising a diazo resin, an acid-substituted ternary acetal polymer, and an unsaturated polyester.

The useful diazo resins include, for example, the condensation product of p-diazo diphenyl amine and paraformaldehyde, the condensation product of 3-methoxy-4-diazo diphenylamine and paraformaldehyde, and the diazo resins of U.S. Pat. Nos. 2,063,631, 2,667,415, 2,667,498, 2,922,715, 2,946,683, 3,050,502, 3,163,633, 3,227,074, 3,311,605, 3,406,159, 3,679,419, 3,849,392 and 3,867,147.

The diazo resin is typically employed in an amount of about 20 to about 70 percent by weight of the photosensitive layer, more preferably in an amount of about 30 to about 60 percent by weight, and most preferably in an amount of about 40 to about 55 percent by weight. The acid-substituted ternary acetal polymer is typically employed in an amount of about 20 to about 75 percent by weight of the photosensitive layer, more preferably in an amount of about 30 to about 60 percent by weight, and most preferably in an amount of about 35 to about 50 percent by weight. The unsaturated polyester is typically employed in an amount of from about 5 to about 40 percent by weight of the photosensitive layer, more preferably in an amount of about 8 to about 30 percent by weight, and most preferably in an amount of about 10 to about 20 percent by weight.

The acid-substituted ternary acetal polymers have recurring units represented by the formula:

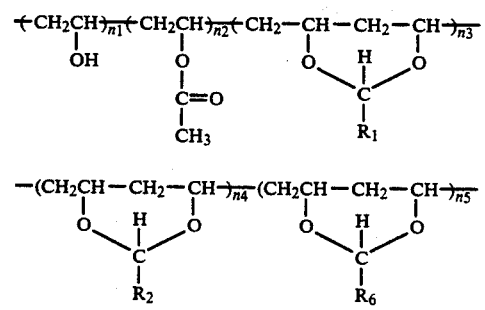

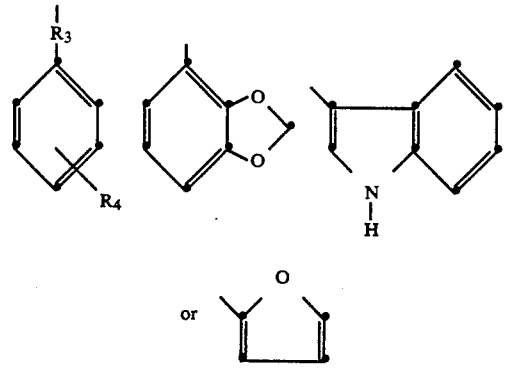

wherein
$R_1$ is —H, —$C_nH_{2n+1}$ or —$C_2H_{2n}$—OH
where n=1-12
$R_2$ is

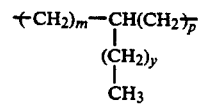

where
$R_3$ is —(—$CH_2$—)$_x$— or $+CH_2)_m$—$CH(CH_2)_p$
                |
              $(CH_2)_y$
                |
               $CH_3$ and
x=0-8
m=0-8
y=0-8 p=0-8
R₄=—H, —R₅,

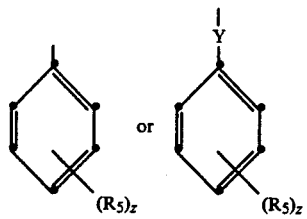

in which
Y=—O—, —S—,

—CH₂—, —NH— or

R₅=—OH, —CH₂OH, —OCH₃, —COOH or —SO₃H
z=1 to 3
R₆=—(CH₂)ₐ—COOH —(CH₂)ₐ—COO⁻M⁺.

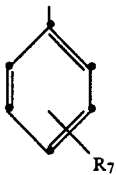

where
R₇=—COOH, —COO⁻M⁺, —(CH₂)ₐCOOH, —O—(CH₂)ₐCOOH, —SO₃H, —SO₃⁻M⁺, —PO₃H₂, —PO₃⁻M₂⁺ —PO₄H₂ or —PO₄⁻M₂⁺,
a=0 to 8
M=Na, K, Li or NH₄
and
$n_1$=0–25 mole %, preferably 3 to 15 mole %
$n_2$=2–25 mole %, preferably 5 to 15 mole %
$n_3$=10–70 mole %, preferably 15 to 50 mole %
$n_4$=10–60 mole %, preferably 12 to 45 mole %
$n_5$=10–45 mole %, preferably 15 to 30 mole %

As indicated by the above structural formula, the acid-substituted ternary acetal polymers can be tetramers, in which the recurring unit comprises a vinyl acetate moiety and first, second and third cyclic acetal groups, or pentamers in which the recurring unit comprises a vinyl alcohol moiety, a vinyl acetate moiety and first, second, and third cyclic acetal groups.

All three of the acetal groups are six-membered cyclic acetal groups, one of them is unsubstituted or substituted with an alkyl or hydroxyalkyl group, another is substituted with an aromatic or heterocyclic moiety, and a third is substituted with an acid group, an acid-substituted alkyl group or an acid-substituted aryl group.

The acid-substituted ternary acetal polymers can be prepared by hydrolyzing polyvinyl acetate, or by starting with partially hydrolyzed polyvinyl acetate, i.e. polyvinyl alcohol, and reacting it with three different aldehydes to thereby form a ternary acetal. Suitable techniques for forming polymers of this type are known to those skilled in the art. Thus, for example, the ternary acetal polymers can be prepared by an emulsion condensation wherein, as the solubility of the starting material changes from water-soluble to solvent-soluble as a result of the formation of the acetal groups, the product forms an emulsion because of its lack of solubility in water. In this method, the particles are prevented from aggregating by use of a surfactant.

An alternative method is to compensate for the change in solubility of the starting material from water-soluble to solvent-soluble by maintaining a homogeneous solution through the continual addition of an appropriate solvent. In the former process, the precipitated particles are filtered, washed and dried. In the latter process, the reaction solution is added to water and mixed in a blender or homogenizer to precipitate the resin product and create particles of the desired size.

The acetalization is catalyzed by the use of an organic or inorganic acid in an amount that will effectively allow protonation to occur, but will not significantly alter the final product by causing unwanted hydrolysis of the acetal groups.

Examples of suitable aldehydes useful in preparing the first cyclic acetal group of the acid-substituted ternary acetal polymers described herein include:
formaldehyde
acetaldehyde
propionaldehyde
n-butyraldehyde
isobutyraldehyde
4-hydroxybutyraldehyde
n-valeraldehyde
5-hydroxyvaleraldehyde
n-caproaldehyde
n-heptaldehyde
and the like.

Examples of suitable aldehydes useful in preparing the second cyclic acetal group of the acid-substituted ternary acetal polymers described herein include:
2-phenyl propionaldehyde
3-phenyl butyraldehyde
benzaldehyde
2-hydroxy benzaldehyde
4-hydroxy benzaldehyde
2,4-dihydroxy benzaldehyde
cinnamaldehyde
hydrocinnamaldehyde
biphenyl carboxaldehyde
indole carboxaldehyde
salicylaldehyde
piperonal
furfural
and the like.

Examples of suitable aldehydes useful in preparing the third cyclic acetal group of the acid-substituted ternary acetal polymers described herein include:
2-formyl phenoxy acetic acid
glyoxylic acid
semiuccinoldehyde
4-formyl phenoxy acetic acid
2-carboxybenzaldehyde
4-carboxybenzaldehyde 2-formyl phenoxy sulfonic acid
2-formyl phenoxy phosphonic acid
and the like.

An especially preferred acid-substituted ternary acetal polymer for use in this invention comprises about 3 mole % of vinyl alcohol moieties, about 12 mole % of vinyl acetate moieties, about 48 mole % of cyclic acetal moieties derived by reaction with propionaldehyde, about 12 mole % of cyclic acetal moieties derived by reaction with 3-phenyl butyraldehyde, and about 25 mole % of cyclic acetal moieties derived by reaction with 2-formyl phenoxy acetic acid.

Another especially preferred acid-substituted ternary acetal polymer for use in this invention comprises about 7 mole % of vinyl alcohol moieties, about 12 mole % of vinyl acetate moieties, about 17 mole % of cyclic acetal moieties derived by reaction with n-butyraldehyde, about 34 mole % of cyclic acetal moieties derived by reaction with benzaldehyde and about 30 mole % of cyclic acetal moieties derived by reaction with glyoxylic acid.

Polyvinyl alcohols suitable for use as starting materials in preparing the acid-substituted ternary acetal polymers are well known commercially available materials. They preferably have an average molecular weight in the range of from about 3,000 to about 120,000. Examples of suitable polyvinyl alcohols include those available in a range of molecular weights from AIR PRODUCTS CORPORATION under the trademarks AIRVOL 203, AIRVOL 205, AIRVOL 523 and AIRVOL 540. Other suitable polyvinyl alcohols include those available from HOECHST-CELANESE under the trademarks MOWIOL 4-88, MOWIOL 5-88, MOWIOL 18-88, MOWIOL 26-88, and MOWIOL 40-88.

As indicated hereinabove, the radiation-sensitive compositions utilized in this invention include an unsaturated polyester as well as an acid-substituted ternary acetal polymer. The unsaturated polyester employed therein is a copolyester of an unsaturated dicarboxylic acid such as fumaric acid or maleic acid, or mixtures thereof, and an oxyalkylene ether of an alkylidene diphenol. A typical example is the copolyester of fumaric acid which has the formula:

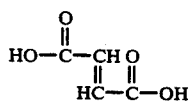

and polyoxypropylene-2,2'-bis(4-hydroxyphenyl)propane which has the formula:

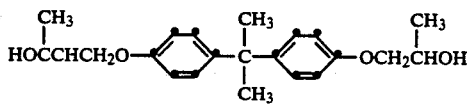

Such copolyesters are well known in the art and are described, for example, in British Patents 722,264, 722,265, 722,266 and 722,273. They are available commercially from Reichhold Chemicals, Inc., as ATLAC 382E BISPHENOL FUMARATE RESIN (also known as ATLAC 32-629-00) and related resins ATLAC 382.05 (a solution of ATLAC 382E in styrene), ATLAC 32-631-000 (also known as ATLAC 382ES), ATLAC 32-628-00 (also known as ATLAC 382A) and ATLAC 32-630-00 (also known as ATLAC 382ESA); from CARGILL INC. as CARGILL 51-5184 resin and CARGILL 74-7451 resin; and from UNION CAMP CORPORATION as UNIREZ 1042 resin.

To prepare the unsaturated polyester, an alkylene oxide, such as propylene oxide, is condensed with an alkylidene diphenol such as bisphenol-A, to give the bis-hydroxyalkyl derivative which, in turn, is reacted with an unsaturated acid, such as fumaric acid, to give the unsaturated polyester.

As described in British Patent No. 722,264, the suitable oxyalkylene ethers of an alkylidene diphenol can be generically represented by the formula:

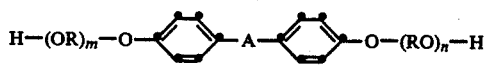

wherein A is a 2-alkylidene radical of 3 or 4 carbon atoms, R is an alkylene radical of 2 or 3 carbon atoms, m and n are each at least one and the sum of m and n is not greater than 3. The esterifying dicarboxylic acid is predominantly fumaric acid, or maleic acid or mixtures thereof, but may include minor proportions of saturated aliphatic acids, aromatic acids or other unsaturated aliphatic acids, such as, for example, succinic acid, sebacic acid, phthalic acid or itaconic acid.

Copolyesters of an unsaturated carboxylic acid and an oxyalkylene ether of an alkylidene diphenol have been found to be especially useful in alleviating problems of blinding that can occur with lithographic printing plates containing an acid-substituted ternary acetal polymer. They provide enhanced properties in this regard without significantly detracting from other important characteristics of the composition. Certain other polymers evaluated were found to also alleviate the blinding problem to some extent but to introduce one or more undesirable features. Examples of such polymers are homoacetals, polyvinyl acetates, epoxies, acrylates and urethanes.

The unsaturated polyesters utilized herein have been employed heretofore in lithographic printing plates, for example, in the printing plates described in U.S. Pat. Nos. 5,045,432, 5,053,315 and 5,061,600 but use thereof in combination with acid-substituted ternary acetal polymers is neither disclosed nor suggested in the prior art.

In addition to a diazo resin, the acid substituted ternary acetal polymer and the unsaturated polyester, the imaging layer of the lithographic printing plate can optionally contain a variety of other ingredients such as colorants, stabilizers, exposure indicators and surfactants. Particularly useful colorants are pigments, including phthalocyanine, anthraquinone and quinacridone pigments. The pigment selected should be one which contains a minimal amount of heavy metal and which forms a stable dispersion with the acid-substituted ternary acetal binder resin. Useful amounts of pigment are from about 1 to about 20 percent by weight of the photosensitive layer, more preferably from about 2 to about 12 percent by weight, and most preferably from about 4 to about 8 percent by weight. Effective stabilizers include both organic and inorganic acids, preferably citric, phosphoric, ascorbic or tartaric acids. Useful amounts of acid are from about 2 to about 6 percent by weight of the photosensitive layer, more preferably from about 2.5 to about 5 percent by weight, and most preferably from about 3 to about 4 percent by weight.

Useful exposure indicators are dyes which are pH sensitive and which do not couple with diazonium compounds. Examples of such dyes include eosin, azobenzene, Victoria Blue, 4-phenylazo diphenylamine, methyl violet and phenolphthalein. Useful amounts of the dye are from about 0.01 to about 3 percent by weight of the photosensitive layer, more preferably from about 0.05 to about 2 percent by weight, and most preferably from about 0.1 to about 1 percent by weight. Useful surfactants include fluorocarbon surfactants, such as FC-430 surfactant from 3M Corporation or Zonyl NS surfactant from DuPont, and silicone surfactants such as Silwet L-7606 surfactant from Union Carbide Corporation or BYK 306 surfactant from BYK CHEMIE. The surfactant is used in an amount of from about 0.1 to about 4 percent by weight of the photosensitive layer, more preferably from about 0.5 to about 2.5 percent by weight, and most preferably from about 1 to about 2 percent by weight.

In forming the photosensitive layer, the diazo resin, the acid-substituted ternary acetal polymer, the unsaturated polyester and the optional ingredients are dispersed in a suitable solvent or mixture of solvents. Particularly useful solvents include 2-methoxyethanol and the acetate thereof, 1-methoxy-2-propanol and the acetate thereof, 2-ethoxyethanol and the acetate thereof, toluene, diisobutyl ketone, butyrolactone, N-methyl pyrrolidone, methyl lactate, ethyl acetate, dimethyl formamide, tetrahydrofuran, methylethyl ketone and butyl acetate.

The support for the lithographic printing plate is typically formed of aluminum which has been grained, for example by electrochemical graining, and then anodized, for example, by means of anodizing techniques employing sulfuric acid and/or phosphoric acid. Methods of both graining and anodizing are very well known in the art and need not be further described herein.

The acid-substituted ternary acetal polymers and unsaturated polyesters described herein can be employed in dual layer lithographic printing plates in which a radiation-sensitive layer comprising a photocrosslinkable polymer is coated over a radiation-sensitive layer containing a diazo resin. Photocrosslinkable polymers which are particularly useful for this purpose are those containing the photosensitive group —CH=- CH—CO— as an integral part of the polymer backbone, especially the p-phenylene diacrylate polyesters. These polymers are described, for example, in U.S. Pat. Nos. 3,030,208, 3,622,320, 3,702,765 and 3,929,489. A typical example of such a photocrosslinkable polymer is the polyester prepared from diethyl p-phenylenediacrylate and 1,4-bis(β-hydroxyethoxy)cyclohexane, which is comprised of recurring units of the formula:

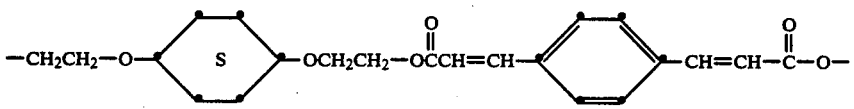

Other particularly useful polymers of this type are those which incorporate ionic moieties derived from monomers such as dimethyl-3,3'-[sodioimino]disulfonyl] dibenzoate and dimethyl-5-sodiosulfoisophthalate. Examples of such polymers include poly[1,4-cyclohexylene-bis(oxyethylene)-p-phenylenediacrylate]-co-3,3'-[(sodioimino)-disulfonyl]dibenzoate and poly[1,4-cyclohexylene-bis(oxyethylene)-p-phenylenedia- crylate]-co-3,3'-(sodioimino)disulfonyl]dibenzoate-co-3-hydroxyisophthalate.

In using the aqueous developing composition described herein, an exposed printing plate is developed by flushing, soaking, swabbing or otherwise treating the crosslinked radiation-sensitive layer. The developing composition selectively solubilizes (i.e., removes) the unexposed areas of the radiation-sensitive layer.

The printing plate can be exposed by any of a wide variety of methods, for example, through a transparency or a stencil, to an imagewise pattern of actinic radiation, preferably rich in ultraviolet light, which crosslinks and insolubilizes the radiation-sensitive polymer in the exposed areas. Suitable light sources include carbon arc lamps, mercury vapor lamps, fluorescent lamps, tungsten filament lamps, "photoflood" lamps, lasers and the like. The exposure can be by contact printing techniques, by lens projection, by reflex, by bireflex, from an image-bearing original or by any other known technique.

The invention is further illustrated by the following examples of its practice.

EXAMPLE 1

A developing composition within the scope of this invention was prepared in accordance with the following formulation:

| Ingredient | Weight % |
| --- | --- |
| 2-phenoxy propanol | 4.95 |
| nonanoic acid | 5.40 |
| sebacic acid (94%) | 0.60 |
| potassium hydroxide | 2.28(1) |
| sodium octyl sulfate (31%) | 6.50 |
| potassium carbonate (anhydrous) | 0.60 |
| K$_2$B$_4$O$_7$.4H$_2$O | 0.50 |
| BURST RSD-10 Antifoam (10%) | 0.04 |
| Water | 79.13 |
| pH = 9.5 | 100.00 |

(1) 2.28 weight percent KOH was used to provide a slight excess over the mole ratio required to form salts of the carboxylic acids. This can be readily calculated as follows:

5.40 grams nonanoic acid@98% purity=5.293 g÷158 g/mole=0.0335 moles.

0.60 grams sebacic acid@94% purity=0.564 g ÷188 g/mole=0.003 moles×2 mole equivalents=0.006 moles.

Total moles of acid to be neutralized=0.0335+0.006=0.0395.

KOH needed=(0.0395 mole equiv.)(56 g/mole KOH)=2.212 grams.

Use of 2.28 grams of KOH provided an excess of 3.1%. Use of an excess of more than 5% is undesirable.

A negative-working lithographic printing plate, as described in the aforesaid copending U.S. patent application Ser. No. 918,868, was exposed with a negative mask and developed with the developing composition described above. To prepare the plate, a radiation-sensitive composition, having the formulation indicated below, was coated on the surface of an aluminum support which had been electrochemically grained, anodized and conditioned with a silicate barrier layer.

| Component | Weight % |
|---|---|
| Diazo resin[1] | 1.111 |
| $H_3PO_4$ (85%) | 0.106 |
| Butyrolactone | 13.545 |
| 1-Methoxy-2-propanol | 69.346 |
| 4-Phenyl azodiphenylamine | 0.017 |
| Ternary acetal polymer[2] | 0.705 |
| Terahydrofuran | 10.957 |
| BYK 306 (10%)[3] | 0.210 |
| Unsaturated polyester[4] | 0.470 |
| Pigment dispersion[5] | 3.533 |
| | 100.000 |

(1) Condensation product of 3-methoxy-4-diazo diphenyl amine sulfate and an isomeric mixture of methoxymethyl substituted diphenyl ethers isolated as the mesitylene sulfonate salt.

(2) Acid-substituted ternary acetal polymer comprising about 2 mole % of vinyl alcohol moieties, about 12 mole % of vinyl acetate moieties, about 48 mole % of cyclic acetal moieties derived by reaction with propionaldehyde, about 12 mole % of cyclic acetal moieties derived by reaction with 3-phenyl butyraldehyde, and about 25 mole % of cyclic acetal moieties derived by reaction with 2-formyl phenoxy acetic acid.

(3) A polyether modified dimethyl polysiloxane surfactant manufactured and sold by BYK CHEMIE.

(4) Copolyester of fumaric acid and polyoxypropylene-2,2'-bis(4-hydroxyphenyl)propane.

(5) The pigment dispersion was prepared by milling 5.3% Hostapern Blue B2G pigment, available from HOECHST-CELANESE Company, and the ternary acetal polymer described in (2) above in a solvent mixture of butyrolactone and 1-methoxy-2-propanol (15:85 w/w).

The plate was developed by immersion and light rubbing for 60 seconds. The mask included a FOGRA target which enables measurement of halation. A 14-step continuous tone step wedge, wherein each step has a density difference of 0.15 and which is part of the negative mask, was found to yield a solid 3/ghost 7 on the plate image and a solid 4/ghost 7 when inked. The background density was measured with an X-RITE 310 densitometer, available from X-RITE Company, using the blue filter. The $D_{min}$ was measured, as an average of five readings, and found to be 0.322. This compares favorably to the uncoated $D_{min}$ of 0.320. The FOGRA target is comprised of three targets, with each being a series of concentric circles with a cross hatch. On the cross hatch is a number scale denoting the number of each circle. The first target uses a 0.005 inch spacer (#1) in the middle, the second uses a 0.01 inch spacer (#2), and the third uses a 0.015 inch spacer (#3). The spacer prevents intimate contact between the plate coating and the emulsion on the FOGRA target. The light passing through the target refracts and exposes coating on either side of the image thereby resulting in partially insolubilized coating. This partially exposed coating can result in halation and is analogous to the phenomenon referred to as "hot spots." The more effective a developer is in desensitizing and removing partially insolubilized edges from the image area, the less likely a plate is to print any halation. In the present instance the printed sheet made from the plate developed with the composition of this example resulted in the following readings:

1-0 (no halation), #2-0, #3-2. These data are representative of a well developed and desensitized plate.

Essentially the same results as those described above were obtained using the following developing composition:

| Ingredient | Weight % |
|---|---|
| Benzyl alcohol | 3.25 |
| Sodium diisopropyl naphthalene sulfonate | 1.90 |
| Potassium dodecanoate | 4.30 |
| Sodium succinate | 0.85 |
| Trisodium phosphate | 0.35 |
| Potassium tetraborate | 0.75 |
| Water | 88.60 |
| pH = 9.5 | 100.00 |

EXAMPLES 2-7

In like manner as described in Example 1, the lithographic printing plate was exposed and processed using each of the developing compositions described in Table I below. These compositions represent variations within the scope of the present invention and all give satisfactory results.

TABLE I

| Ingredients | Ex. 2 | Ex. 3 | Ex. 4 | Ex. 5 | Ex. 6 | Ex. 7 |
|---|---|---|---|---|---|---|
| 2-Phenoxypropanol | — | 2.80 | — | 4.95 | — | — |
| N-Methylpyrrolidone | — | — | 2.25 | — | — | 1.50 |
| 2-Phenoxyethanol | 3.52 | — | — | — | 4.23 | — |
| Sodium octanoate | — | 5.55 | — | — | 6.05 | — |
| Potassium nonanoate | 5.42 | — | — | 6.57 | — | 4.88 |
| Potassium decanoate | — | — | 7.32 | — | — | — |
| Sodium suberate | — | 1.23 | — | — | 0.93 | 1.10 |
| Potassium sebacate | 0.82 | — | 0.70 | 0.68 | — | — |
| Sodium octyl sulfate | 3.22 | — | — | 2.02 | — | 1.76 |
| Sodium xylene sulfonate | — | — | 4.15 | — | — | — |
| Potassium decyl sulfate | — | 2.75 | — | — | 5.03 | — |
| Sodium carbonate | 2.05 | — | — | — | 0.42 | — |
| Potassium carbonate | — | 1.16 | — | 0.60 | — | — |
| Disodium phosphate | — | — | 3.78 | — | — | 1.43 |
| Sodium oxalate | — | 0.44 | 1.62 | — | — | — |
| Potassium tetraborate | — | — | — | 0.50 | — | 0.78 |
| Sodium nitrate | 2.34 | — | — | — | 0.92 | — |
| Water | 82.63 | 86.07 | 80.28 | 84.68 | 82.42 | 88.55 |

EXAMPLE 2

The T-14 scale on the plate gives a solid 3/ghost 7 and a solid 4/ghost 8 when inked. The Dmin is measured to be 0.324. The FOGRA readings are #1-0, #2-1 and #3—3. These data are interpreted to be indicative of a well-developed plate.

EXAMPLE 3

The T-14 scale on the plate gives a solid 3+/ghost 8 and a solid 4/ghost 8 when inked. The Dmin is measured to be 0.325. The FOGRA readings are #1-0, #2-1, #3-4. These data are interpreted to be indicative of a well-developed plate.

EXAMPLE 4

The T-14 scale on the plate gives a solid 2+/ghost 7 and a solid 3/ghost 6 when inked. The Dmin is measured to be 0.321. The FOGRA readings are #1-0, #2-0, #3-1. These data are interpreted to be indicative of a well-developed plate.

EXAMPLE 5

The T-14 scale on the plate gives a solid 3/ghost 7 and a solid 3/ghost 7 when inked. The Dmin is measured to be 0.322. The FOGRA readings are #1-0, #2-0 and #3-1. These data are interpreted to be indicative of a well-developed plate.

EXAMPLE 6

The T-14 scale on the plate gives a solid 3/ghost 7 and a solid 4/ghost 7 when inked. The $D_{min}$ measured to be 0.324. The FOGRA readings are #1-0, #2-0, and #3-1. These data are interpreted to be indicative of a well-developed plate.

EXAMPLE 7

The T-14 scale on the plate gives a solid 3+/ghost 8+ and a solid 4/ghost 8 when inked. The $D_{min}$ is measured to be 0.326. The FOGRA readings are #1-0, #2-1, and #3-4. These data are interpreted to be indicative of a well-developed plate.

COMPARATIVE EXAMPLES 8 TO 13

In like manner as described in Example 1, the lithographic printing plate was exposed and processed using each of the developing compositions described in Table II below. These compositions represent variations outside the scope of the present invention and all gave unsatisfactory results. Examples 8 to 13 are duplicative of Examples 2 to 7 except that one of the essential ingredients was omitted in each instance. Additional water was added to the composition to make up for the ingredient omitted. The results obtained indicate the criticality of using all of the essential ingredients specified since omission of any one essential ingredient leads to unsatisfactory results.

TABLE II

| Ingredients | Ex. 8 | Ex. 9 | Ex. 10 | Ex. 11 | Ex. 12 | Ex. 13 |
| --- | --- | --- | --- | --- | --- | --- |
| 2-Phenoxypropanol | — | 2.80 | — | 4.95 | — | — |
| N-Methyl pyrrolidone | — | — | 2.25 | — | — | 1.50 |
| 2-Phenoxyethanol | * | — | — | — | 4.23 | — |
| Sodium octanoate | — | * | — | — | 6.05 | — |
| Potassium nonanoate | 5.42 | — | — | 6.57 | — | 4.88 |
| Potassium decanoate | — | — | 7.32 | — | — | — |
| Sodium suberate | — | 1.23 | — | — | 0.93 | 1.10 |
| Potassium sebacate | 0.82 | — | * | 0.68 | — | — |
| Sodium octyl sulfate | 3.22 | — | — | * | — | 1.76 |
| Sodium xylene sulfonate | — | — | 4.15 | — | — | — |
| Potassium decyl sulfate | — | 2.75 | — | — | 5.03 | — |
| Sodium carbonate | 2.05 | — | — | — | * | — |
| Potassium carbonate | — | 1.16 | — | 0.60 | — | — |
| Disodium phosphate | — | — | 3.68 | — | — | 1.43 |
| Sodium oxalate | — | 0.44 | 1.62 | — | — | — |
| Potassium tetraborate | — | — | — | 0.50 | — | * |
| Sodium nitrate | 2.34 | — | — | — | 0.92 | — |
| Water | 86.15 | 91.62 | 80.98 | 86.70 | 82.84 | 89.33 |

*Denotes the ingredient omitted.

COMPARATIVE EXAMPLE 8

The 2-phenoxyethanol was excluded from the formulation. It is observed that the coating was not removed. With time and considerable effort, it is possible to break through the coating. Complete development was not possible, therefore assessments of the background and image could not be made.

COMPARATIVE EXAMPLE 9

The sodium octanoate was removed from the formulation. The plate is developed but in a particulate rather than dissolving manner. This is seen as possibly acceptable for hand processing, but unsuitable for machine processing. The T-14 scale on the plate gives a solid 5/ghost 13. The $D_{min}$ is measured as 0.386. A yellow stain is observed in the background and in the long toe of the step wedge. The FOGRA readings are #1-3, #2-11, and #3-24. The high solid step suggests incomplete development while the very long ghost step indicates low contrast as well as incomplete development. Further, the post development density of 0.386 is significantly higher than the uncoated density of 0.320. Such a difference indicates incomplete development which may lead to poor printing. Finally, the FOGRA readings are extremely high and would suggest hot spots to be a severe problem.

COMPARATIVE EXAMPLE 10

The potassium sebecate was removed from the formulation. The plate develops quickly and in a dissolving manner which would suggest a good result. The plate is observed to have a slight discoloration in the background. When measured, the $D_{min}$ is 0.353. Relative to the uncoated substrate $D_{min}$ of 0.320, the 0.033 difference indicates a significant amount of coating remains. The T-14 scale on the plate gives a solid 3/ghost 7 and a solid 3/ghost 8 when inked. The FOGRA readings are #1-0, #2-3, and #3-7.

COMPARATIVE EXAMPLE 11

The sodium octyl sulfate was removed from the formulation. The plate is developed but in a rather slow manner. The removed coating is slightly particulate and has a tendency not to be dispersed but rather adhere to the image as redeposit. Although the plate was fully processed it could not be considered for use on a press due to the excessive particulate redeposit. The T-14 in the plate gives a solid 3+/ghost 7 and a solid 4/ghost 8 when inked. The $D_{min}$ is measured to be 0.342. The FOGRA readings are #1-0, #2-2, and #3-5.

COMPARATIVE EXAMPLE 12

The sodium carbonate was removed from the formulation. The plate develops in a rather stringy manner and also slowly. Although not redepositing, the removed coating remains stringy and particulate. Most of the coating will not dissolve in the developer. When the plate is water rinsed, the amorphous particulate matter forms discrete particles which have a slight tendency to adhere to the image. The T-14 4/ghost 8 when inked. The FOGRA readings are #1-0, #2-3, and #3-8.

COMPARATIVE EXAMPLE 13

The potassium tetraborate was removed from the formulation. The plate develops quickly and in a dissolution manner. The plate appears to be adequately developed. Upon closer inspection, it is seen that the background exhibits a slight discoloration. The $D_{min}$ is measured to be 0.347 thereby indicating incomplete desensitization. The T-14 scale on the plate give a solid 3/ghost 9 and a solid 3/ghost 9 when inked. The FOGRA readings are #1-0, #2-4, and #3-8.

The invention has been described in detail, with particular reference to certain preferred embodiments thereof, but it should be understood that variations and modifications can be effected within the spirit and scope of the invention.

We claim:

1. A method of imaging a negative-working lithographic printing plate, which method comprises imagewise-exposing a lithographic printing plate comprising a support having thereon a radiation-sensitive layer, comprising a diazo resin, an acid-substituted ternary acetal polymer and an unsaturated polyester, and contacting said imagewise-exposed lithographic printing plate with an aqueous alkaline developing composition comprising (1) an organic solvent, (2) an anionic surface active agent, (3) sodium oxalate, sodium nitrate or an alkali metal tetraborate, (4) an aliphatic monocarboxylic acid containing 6 to 22 carbon atoms, (5) an aliphatic dicarboxylic acid containing 4 to 16 carbon atoms, and (6) an alkaline buffering system in an amount sufficient to provide a pH in the range of from 8 to 12; said unsaturated polyester being a copolyester of an unsaturated dicarboxylic acid and an oxyalkylene ether of an alkylidene diphenol and said acid-substituted ternary acetal polymer being represented by the formula:

$$-(CH_2CH)_{\overline{n_1}}-(CH_2CH)_{\overline{n_2}}-(CH_2-CH-CH_2-CH)_{\overline{n_3}}-$$
with substituents OH; O-C(=O)-CH$_3$; and O-C(H)(R$_1$)-O $$-(CH_2CH-CH_2-CH)_{\overline{n_4}}-(CH_2CH-CH_2-CH)_{\overline{n_5}}-$$
with substituents O-C(H)(R$_2$)-O and O-C(H)(R$_6$)-O wherein
$R_1$ is —H, —$C_nH_{2n+1}$ or —$C_2H_{2n}$—OH
where
$n = 1-12$
$R_2$ is

[phenyl with R$_3$ substituent; benzodioxole; indole (N—H); furan]

where
$R_3$ is $-(CH_2)_{\overline{x}}$ or $-(CH_2)_m CH(CH_2)_{\overline{p}}$
            |
            (CH$_2$)$_y$
            |
            CH$_3$ and
$x = 0-8$
$m = 0-8$
$y = 0-8$
$p = 0-8$
$R_4 = $ —H, —$R_5$,

[phenyl with (R$_5$)$_z$] or [phenyl with Y and (R$_5$)$_z$]

in which
$Y = $ —O—, —S—, $-\overset{O}{\underset{O}{\overset{\|}{\underset{\|}{S}}}}-$, —CH$_2$—, —NH— or $CH_3\overset{|}{\underset{|}{C}}CH_3$ $R_5 = $ —OH, —CH$_2$OH, —OCH$_3$, —COOH or —SO$_3$H
$z = 1$ to $3$
$R_6 = $ —$(CH_2)_a$—COOH —$(CH_2)_a$—COO$^\ominus$M$^\oplus$ or

[phenyl with R$_7$ substituent]

where
$R_7 = $ —COOH, —COO$^\ominus$M$^\oplus$, —$(CH_2)_a$COOH, —O—$(CH_2)_a$COOH, —SO$_3$H, —SO$_3^\ominus$M$^\oplus$, —PO$_3$H$_2$, —PO$_3^\ominus$M$_2^\oplus$ —PO$_4$H$_2$ or —PO$_4^\ominus$M$_2^\oplus$,
$a = 0$ to $8$
$M = $ Na, K, Li or NH$_4$
and
$n_1 = 0-25$ mole %
$n_2 = 2-25$ mole %
$n_3 = 10-70$ mole %
$n_4 = 10-60$ mole %
$n_5 = 10-45$ mole %.

2. A method as claimed in claim 1 wherein $n_1$ is equal to 3 to 15 mole %, $n_2$ is equal to 5 to 15 mole %, $n_3$ is equal to 15 to 50 mole %, $n_4$ is equal to 12 to 45 mole % and $n_5$ is equal to 15 to 30 mole %.

3. A method as claimed in claim 1 wherein
$R_1$ is —CH$_2$CH$_3$
$R_2$ is

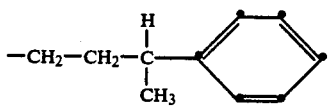

and R$_6$ is

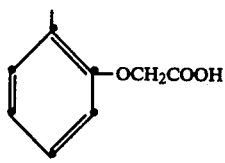

4. A method as claimed in claim 1, wherein said unsaturated dicarboxylic acid is selected from the group consisting of fumaric acid, maleic acid and mixtures thereof.

5. A method as claimed in claim 1, wherein said copolyester is a copolyester of fumaric acid and an oxyalkylene ether of an alkylidene diphenol of the formula:

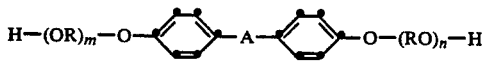

wherein A is a 2-alkylidene radical of 3 or 4 carbon atoms, R is an alkylene radical of 2 or 3 carbon atoms, m and n are each at least one and the sum of m and n is greater than 3.

6. A method as claimed in claim 1, wherein said copolyester is a copolyester of fumaric acid and polyoxypropylene-2,2'-bis(4-hydroxyphenyl)propane.

7. A method as claimed in claim 1 wherein said diazo resin is a condensation product of 3-methoxy-4-diazo diphenylamine sulfate and an isomeric mixture of methoxymethyl substituted diphenyl ethers.

8. A method as claimed in claim 1 wherein said support is comprised of grained and anodized aluminum.

9. A method as claimed in claim 1 wherein said radiation-sensitive layer is comprised of about 40 to about 55 percent by weight of said diazo resin, about 35 to about 50 percent by weight of said acid-substituted ternary acetal polymer, and about 10 to about 20 percent by weight of said copolyester.

10. A method as claimed in claim 1 wherein said organic solvent is present in an amount of from about 2.5 to about 7 weight percent, said anionic surface active agent is present in an amount of from about 1.2 to about 8 weight percent, said alkali metal tetraborate is present in an amount of from about 0.1 to about 3 weight percent, said aliphatic monocarboxylic acid is present in an amount of from about 2.5 to about 8 weight percent, and said aliphatic dicarboxylic acid is present in an amount of from about 0.4 to about 3 weight percent, with said weight percent in each case being based on the total weight of said developing composition.

11. A method as claimed in claim 1 wherein the pH of said developing composition is in the range of from 9 to 10.

12. A method as claimed in claim 1 wherein the organic solvent is 2-phenoxypropanol.

13. A method as claimed in claim 1 wherein the anionic surface active agent is sodium octyl sulfate.

14. A method as claimed in claim 1 wherein the aliphatic monocarboxylic acid is nonanoic acid 15. A method as claimed in claim 1 wherein the aliphatic dicarboxylic acid is sebacic acid.

16. A method as claimed in claim 1 wherein said alkaline buffering system comprises potassium hydroxide and potassium carbonate.

17. A method as claimed in claim 1 wherein said developing composition comprises:
(1) 2-phenoxypropanol in an amount of from about 2.5 to about 7 weight percent,
(2) sodium octyl sulfate in an amount of from about 1.2 to about 8 weight percent,
(3) potassium tetraborate in an amount of from about 0.1 to about 3 weight percent,
(4) nonanoic acid in an amount of from about 2.5 to about 8 weight percent,
(5) sebacic acid in an amount of from about 0.4 to about 3 weight percent, and
(6) potassium hydroxide and potassium carbonate in an amount sufficient to provide a pH in the range of from 8 to 12, with said weight percent in each case being based on the total weight of said developing composition.

* * * * *